United States Patent
Park et al.

(10) Patent No.: US 6,954,827 B2
(45) Date of Patent: Oct. 11, 2005

(54) CACHE MEMORY CAPABLE OF SELECTING SIZE THEREOF AND PROCESSOR CHIP HAVING THE SAME

(75) Inventors: Jae-Hong Park, Seongnam (KR); Jong-Taek Kwak, Suwon (KR); Jin-Ho Kwack, Suwon (KR)

(73) Assignee: Samsung Electronics, Co., Ltd. (KR)

( * ) Notice: Subject to any disclaimer, the term of this patent is extended or adjusted under 35 U.S.C. 154(b) by 166 days.

(21) Appl. No.: 10/307,864

(22) Filed: Dec. 2, 2002

(65) Prior Publication Data

US 2003/0131196 A1 Jul. 10, 2003

(30) Foreign Application Priority Data

Dec. 4, 2001 (KR) ........................................ 2001-76262

(51) Int. Cl.[7] ............................................. G06F 12/00
(52) U.S. Cl. .............................. 711/128; 711/3; 365/49
(58) Field of Search ....................... 711/128, 3; 365/49

(56) References Cited

U.S. PATENT DOCUMENTS

| 5,551,004 A | 8/1996 | McClure ..................... 395/465 |
| 6,131,143 A | 10/2000 | Sakai ......................... 711/128 |
| 2003/0088811 A1 * | 5/2003 | Cherabuddi et al. .......... 714/42 |

FOREIGN PATENT DOCUMENTS

| JP | 05-197622 | 8/1993 | ........... G06F/12/08 |
| JP | 10-254771 | 9/1998 | ........... G06F/12/08 |

* cited by examiner

*Primary Examiner*—Jack A. Lane
(74) *Attorney, Agent, or Firm*—Mills & Onello LLP

(57) ABSTRACT

A multi-way set-associative cache memory is configured to operate only with those ways of the tag and data memories that operate normally, and excludes those ways of the tag and data memories that are determined to be incurably defective. By reducing the size of the cache memory to exclude the defective cells, the present invention is capable of preventing scrapping or discarding of the entire high-priced processor chip in which CPU and cache memory are integrated into a single chip.

42 Claims, 12 Drawing Sheets

Fig. 8

|  |  | Activated Selection Signal |  |  |  |  |  |  |  |
|---|---|---|---|---|---|---|---|---|---|
|  |  | D1 | D2 | D3 | D4 | D5 | D6 | X | |
| FUSE | F1 | 0 | 0 | 0 | 0 | 1 | 1 | 1 | 1 |
|  | F2 | 0 | 0 | 1 | 1 | 0 | 0 | 1 | 1 |
|  | F3 | 0 | 1 | 0 | 1 | 0 | 1 | 0 | 1 |

0 : No Cutting    1 : Cutting

Fig. 9B

| Fuse Decoder | Program State of Fuse (0:No cutting 1:Cutting) | | | Decoding Signal (D1 ~ D6) | Way Selection signal Generator (W.S.G) | Selected Input Terminal of Way Selection Signal Generator |
|---|---|---|---|---|---|---|
| | F1 | F2 | F3 | | | |
| Fuse Decoder(200a) | 0 | 0 | 0 | H L L L L L | W.S.G(110a) | IN1 |
| Fuse Decoder(200b) | 1 | 1 | 1 | L L L L L L | W.S.G(110b) | X |
| Fuse Decoder(200c) | 0 | 1 | 0 | L L H L L L | W.S.G(110c) | IN3 |
| Fuse Decoder(200d) | 0 | 1 | 1 | L L L H L L | W.S.G(110d) | IN4 |
| Fuse Decoder(200e) | 1 | 0 | 1 | L L L L L H | W.S.G(110e) | IN6 |
| Fuse Decoder(200f) | 0 | 0 | 0 | H L L L L L | W.S.G(110f) | IN1 |
| Fuse Decoder(200g) | 1 | 1 | 0 | L L L L L L | W.S.G(110g) | X |
| Fuse Decoder(200h) | 0 | 0 | 0 | H L L L L L | W.S.G(110h) | IN1 |
| Fuse Decoder(200i) | 1 | 0 | 0 | L L L L H L | W.S.G(110i) | IN5 |

Fig. 10B

| Fuse Decoder | Program State of Fuse (0:No cutting 1:Cutting) | | | Decoding Signal (D1 ~ D6) | Way Selection signal Generator (W.S.G) | Selected Input Terminal of Way Selection Signal Generator |
|---|---|---|---|---|---|---|
| | F1 | F2 | F3 | | | |
| Fuse Decoder(200a) | 1 | 0 | 1 | L L L L L H | W.S.G(110a) | IN6 |
| Fuse Decoder(200b) | 0 | 0 | 0 | H L L L L L | W.S.G(110b) | IN1 |
| Fuse Decoder(200c) | 1 | 1 | 1 | L L L L L L | W.S.G(110c) | X |
| Fuse Decoder(200d) | 1 | 1 | 1 | L L L L L L | W.S.G(110d) | X |
| Fuse Decoder(200e) | 1 | 1 | 1 | L L L L L L | W.S.G(110e) | X |
| Fuse Decoder(200f) | 1 | 0 | 0 | L L L L H L | W.S.G(110f) | IN5 |
| Fuse Decoder(200g) | 1 | 0 | 0 | L L L L H L | W.S.G(110g) | IN5 |
| Fuse Decoder(200h) | 1 | 1 | 1 | L L L L L L | W.S.G(110h) | X |
| Fuse Decoder(200i) | 1 | 1 | 1 | L L L L L L | W.S.G(110i) | X |

… # CACHE MEMORY CAPABLE OF SELECTING SIZE THEREOF AND PROCESSOR CHIP HAVING THE SAME

RELATED APPLICATION

This application relies for priority upon Korean Patent Application No. 2001-76262, filed on Dec. 4, 2001, the contents of which are herein incorporated by reference in their entirety.

FIELD OF THE INVENTION

The present invention relates to a semiconductor integrated circuit, and more particularly to a cache memory capable of selecting a size thereof and a processor chip having the same.

BACKGROUND OF THE INVENTION

When typical programs are analyzed, there is a tendency that a memory reference of a given time is conducted in a limited area of memory. This phenomenon is referred to as a "locality of reference," which can be readily understood by the fact that a program loop and a subroutine are frequently used for typical computer programs and are sequentially processed. In addition, a memory reference to data is generally limited to one area of memory, which is applicable to a table-lookup process and a repeating process referring to a common memory and arrangement.

If a frequently referred to program segment and data are stored in a high-speed small-size memory, average memory access time is shortened, thereby reducing the processing time required for performing the program. Such a high-speed small-size memory is commonly referred to as a "cache memory." In general, access time of a cache memory formed of SRAM (static random access memory) is 5–10 times as fast as that of a main memory formed of DRAM (dynamic random access memory). Cache is generally the fastest memory device in the hierarchy of memories and approximates to the speed of the CPU (central processing unit).

The basic operation of cache is as follows. When a CPU requires an access to memory, cache is first investigated. When a desired word is found in cache, the CPU reads out the word. When a desired word is not found in cache, the CPU accesses main memory for reading out the word. A block of the main memory that includes the word is transferred from the main memory to cache memory. A size of the block is commonly on the order of about 1–16 words.

The performance of a cache memory is measured according to "hit ratio". When CPU refers to a memory and finds the desired word in cache, this process is referred to as a "hit." However, when the CPU does not find the word in cache, but rather in a main memory, the process is referred to as a "miss." The "hit rate" represents a ratio of the number of hits divided by the total number of memory references performed by CPU. The hit rate is experimentally measured by performing a typical program and calculating the number of hits and misses during a given time period. The hit ratio is generally greater than 0.9, which is to demonstrate the locality of a memory reference.

The basic characteristic of the cache memory is a rapid access time such that it takes little time to locate a word in cache. To transfer data from the main memory to the cache memory is referred to as a "mapping process," which is divided into associative mapping, direct mapping, and set-associative mapping.

The cache memory adopting the associative mapping is the fastest and the most flexible. The associative memory stores an address and data of a memory word. An address of the CPU is stored in an argument register. The associative memory locates the same address as the address in the argument register, reads corresponding data, and sends the data to the CPU. If there does not arise a hit condition, the associative memory locates the word in a main memory and stores the address and data in the associative cache memory. If the cache memory is full, a pair of address and data should be replaced to store a necessary word that does not exist in the cache. The pair that is to be removed is determined by a replacement algorithm as selected by a designer.

In direct mapping, an address of the CPU is divided into an index field and a tag field. Each word of the cache memory is formed of a data word and a tag. If the CPU requests a reference of memory, the index field of a CPU address is used as an address for accessing the cache. Comparing the tag field of the CPU address with that of a word read out from the cache, if both are consistent, it is a hit condition representing that desired data is in the cache. Otherwise, it is a miss condition and a desired word is read out from the main memory. The word has a new tag and is stored in the cache. A disadvantage of the direct mapping is that if two or more words, which have the same index and different tags, repeatedly access, a hit rate may be markedly lowered.

The set-associative mapping is used to compensate for this weakness in direct mapping so that each word of the cache may store two or more memory words under the same index address. Each data word is stored together with a tag, and tag word items in a word constitute a single set.

Recently, with developments in semiconductor fabrication, CPUs and cache memories have been integrated in a single chip. FIG. 1 is a schematic diagram illustrating a configuration of a single processor chip 1 in which CPU 2 and a cache memory 3 are integrated. The processor chip 1 may comprise a CPU 2, or other types of processors such as DSPs (digital signal processors) or microprocessors. In the case where the cache memory and the CPU are embedded in a single chip, the number of data bits that are communicated between the CPU chip and the cache memory is highly increased in order to elevate the resulting input/output speed of data. As a result, the general performance of the CPU may be improved. However, because the embedded cache memory has a restriction on a size as compared to an external cache memory, its cache hit rate may be lowered. Accordingly, when cache memories are embedded in the CPU chip, a set size of a set-associative cache memory has been increased to compensate for reduction in the cache hit rate caused by downsizing.

FIG. 2 illustrates an example of a multi-way set-associative cache memory configuration, which is disclosed by Toshichika on Oct. 10, 2000 in U.S. Pat. No. 6,131,143 entitled "MULTI-WAY ASSOCIATIVE STORAGE TYPE CACHE MEMORY."

The cache memory illustrated in FIG. 2 is a 9-way set-associative cache memory. In FIG. 2, an address 10 supplied from the CPU 2 to an address bus is formed of a tag address 11 and a set address 12.

Referring to FIG. 2, the cache memory 3 comprises a decoder 20, 9 tag memories 30$a$–30$i$, valid bits 31$a$–31$i$, data memories 40$a$–40$i$, comparators 50$a$–50$i$, and a way selector 55.

The decoder 20 decodes the set address 12 of the address 10. The tag memories 30$a$–30$i$ and the data memories 40a–40i include k lines (i.e., sets), and each of the sets stores data. The data memories 40a–40i supply the cache size selector 60 with data stored in the set selected by a set address decoded by the decoder 20. The valid bits 31a–31i represent whether or not the contents stored in corresponding data memories 30a–30i are valid, respectively. The way selector 55 selects one of or none of output data among the data memories 40a–40i in response to signals HITa–HITi that represent results of the comparators 50a–50i.

In FIG. 2, suffixes a and i of references, such as 30a and 30i representing the tag memories and 40a and 40i representing the data memories, represent ways a and b, respectively.

Next, the operation of the cache memory 3 will be explained.

When the address 10 is supplied from the CPU 2, the set address 12 is decoded by the decoder 20. The contents stored in the selected set address of the tag memories 30a–30i are supplied to the comparators 50a–50i, respectively. In addition, the contents stored in the selected set address of the data memories 40a–40i are supplied to the way selector 55.

When one of the comparators 50a–50i determines that the contents stored in the selected set address of the tag memories 30a–30i are consistent with the address tag 11 and corresponding valid bits 31a, 31b, . . . , or 31i are active, a corresponding bit signal HITa, HITb, . . . , or HITi becomes active.

When there is present a way in which the contents stored in the selected set address of the tag memory 30a, 30b, . . . , or 30i are identical with the tag address 11, data of the way is output from the way selector 55. When there is present no way in which the contents stored in the selected set address of the tag memory 30a, 30b, . . . , or 30i are identical with the tag address 11, data stored in a main memory (not shown) rather than the cache memory is accessed by the CPU 2. In addition, the data in the main memory accessed by the CPU 2 is stored in the data memory 40a, 40b, . . . , or 40i of the cache memory 3.

In the cache memory explained above, the tag memories 30a–30i and data memories 40a–40i are formed of a plurality of memory cells, and the cache memory further comprises redundant cells for replacing defective memory cells. Generally, the last step of manufacturing semiconductor integrated circuits is to test whether or not the manufactured semiconductor integrated circuit is defective. In the test step, if it is determined that a cache memory includes a defective memory cell, the memory cell is replaced by a redundant cell. However, because the number of the redundant cells is limited, when a defective cell cannot be replaced by a redundant cell, the integrated circuit should be scrapped or discarded.

In a processor chip in which CPU and a cache memory are integrated, if the cache memory includes defective cells that cannot be replaced by redundant cells, the processor chip must be scrapped or discarded. In general, CPU fabrication is expensive relative to fabrication of other semiconductor integrated circuits. Therefore, it is a substantial loss to scrap or discard the entire processor chip when several defective cells of the cache memory are present.

SUMMARY OF THE INVENTION

It is therefore a feature of the present invention to provide a processor chip having a cache memory capable of selecting size thereof.

It is another feature of the present invention to provide a processor chip having a multi-way set-associative cache memory that is capable of selecting and using only operational tag and data memories and excluding those tag and data memories having defective cells.

It is still another feature of the present invention to provide a cache memory capable of selecting size thereof.

The feature of the present invention may be achieved by a data processing system comprising a processor and a multi-way set-associative cache memory for storing data to be used by the processor. In particular, the cache memory includes a data memory being divided into a plurality of ways and for storing data to be used by the processor, a tag memory being divided into a plurality of ways and for storing a tag address, and a cache size selector for selecting for operation those ways of among the plurality of ways of the data memory and tag memory that are determined to function normally, and to exclude from operation those ways among the plurality of ways of the data memory and tag memory having defective memory cells, the number of ways of selected data memory being equal to the number of selected ways of tag memory.

In a preferred embodiment, the data processing system further comprises comparing means for respectively comparing a predetermined address from the processor with tag addresses stored in the selected ways of the tag memory and outputting hit signals respectively representing whether or not the predetermined address is identical with the tag address stored in each way of the tag memory. At this time, the cache size selector receives the hit signals from the selected ways of the tag memory and corresponds the hit signals to the selected ways of the data memory.

The cache size selector is configured with a first selection circuit for receiving hit signals corresponding to the selected ways of the tag memory among the hit signals and outputting a plurality of selection signals corresponding respectively to ways of the data memory, and a second selection circuit for supplying the processor with the data stored in one of the ways of the data memory according to the selection signals. When all the hit signals indicate that the predetermined address is not identical with a tag address stored in a way of the tag memory, the second selection circuit supplies none of data stored in the data memory to the processor.

The first selection circuit includes a plurality of selection signal generating circuits corresponding respectively to the ways of the data memory and for selectively receiving one of the hit signals corresponding to the selected ways of the tag memory and outputting the selection signal for selecting a way of the data memory.

When a way corresponding to the data memory is selected, each of the selection signal generating circuits selectively receives one of the hit signals corresponding to the selected ways of the tag memory. When a way corresponding to the data memory is not selected, each of the selection signal generating circuits receives none of the hit signals and does not output the selection signal.

Meanwhile, each of the selection signal generating circuits comprises input terminals for receiving the hit signals corresponding to the selected ways of the tag memory, storing means for storing information as to whether or not one of or none of the hit signals are received from the comparing means, a decoder for decoding the information stored in the storing means to output decoding signals, and a selection signal generator for receiving one of the hit signals input via the input terminals to output the selected signals or for receiving none of the hit signals such that the selected signal is not output, in response to the decoding signals.

In this case, the storing means comprises at least one fuse. The number of the input terminals is a number obtained by adding 1 to a difference between the number of the maximum selectable ways and the number of the minimum selectable ways of the data and tag memories.

The other feature of the present invention can be achieved by a data processing system comprising a processor and a multi-way set-associative cache memory for storing data to be used by the processor. The cache memory comprises a data memory being divided into a plurality of ways and for storing data to be used by the processor. A tag memory is divided into a plurality of ways and stores a tag address. Comparing means compares a predetermined address from the processor with tag addresses stored in ways of the tag memory, respectively, and outputs hit signals that respectively represent whether or not the predetermined address is consistent with a tag address stored in each way of the tag memory. A cache memory size selection circuit selects for operation the hit signals corresponding to a portion of ways of the tag memory as well as a portion of ways of the data memory. The number of selected hit signals is equal to the number of selected ways of the data memory.

In the preferred embodiment, the cache memory size selection circuit respectively selects for operation those ways among the plurality of ways of the data memory and the tag memory that are determined to function normally, and excludes from operation those ways among the plurality of ways of the data memory and the tag memory having defective memory cells.

The cache memory size selection circuit further comprises a plurality of selection signal generating circuits corresponding respectively to ways of the data memory. A plurality of the selection signal generating circuits each receive one of the hit signals corresponding to the normally functioning ways of the tag memory and output a selection signal for selecting a corresponding way of the data memory. Also, the cache memory size selection circuit further comprises an output circuit for supplying the processor with data stored in a way of the data memory selected by the selection signals.

When all the hit signals indicate that the predetermined address is not consistent with the tag address stored in a way corresponding to the tag memory, the processor is supplied with none of data stored in the data memory.

The other feature of the present invention can be achieved by a multi-way set-associative cache memory comprising a data memory being divided into a plurality of ways and for storing data to be used by the processor. A cache size selects for operation those ways of among the plurality of ways of the data memory and tag memory that are determined to function normally, and excludes from operation those ways among the plurality of ways of the data memory and tag memory having defective memory cells, the number of ways of selected data memory being equal to the number of selected ways of tag memory.

The multi-way set-associative cache memory further comprises comparing means for respectively comparing a predetermined address from the processor with tag addresses stored in the selected ways of the tag memory and outputting hit signals that respectively represent whether or not the predetermined address is consistent with a tag address stored in each way of the tag memory. At this time, the cache size selector receives the hit signals from the selected ways of the tag memory and corresponds the hit signals to the selected ways of the data memory.

The other feature of the present invention can be achieved by a multi-way set-associative cache memory comprising a data memory being divided into a plurality of ways and for storing data to be used by a processor. A tag memory is divided into a plurality of ways and stores a tag address. Comparing means compares a predetermined address from the processor with tag addresses stored in ways of the tag memory, respectively, and outputs hit signals that respectively represent whether or not the predetermined address is consistent with a tag address stored in each way of the tag memory. A size selection circuit selects for operation the hit signals corresponding to a portion of the ways of the tag memory and a portion of the ways of the data memory, the number of selected hit signals being equal to the number of selected ways of the data memory.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 8 illustrates decoding signals being activated according to a program state of fuses of FIG. 7;

FIG. 9B illustrates a program state of each fuse of fuse decoders, states of decoding signals thereof, and a selected input terminal of each way selection signal generator according to the example of FIG. 9A;

FIG. 10B illustrates a program state of each fuse of fuse decoders, states of decoding signals thereof, and a selected input terminal of each way selection signal generator.

DETAILED DESCRIPTION OF PREFERRED EMBODIMENTS

The present invention will now be more fully described hereinafter with reference to the accompanying drawings, in which preferred embodiments of the invention are shown.

A multi-way set-associative cache memory of the present invention may be operated with ways of operational tag and data memories, and excluding ways of tag and data memories with incurably defective cells. By changing the size of the resulting cache memory, the present invention prevents scrapping or discarding of the entire expensive processor chip in which CPU and a cache memory are integrated on a single chip due to several defective cells of the cache memory.

Figure 1:
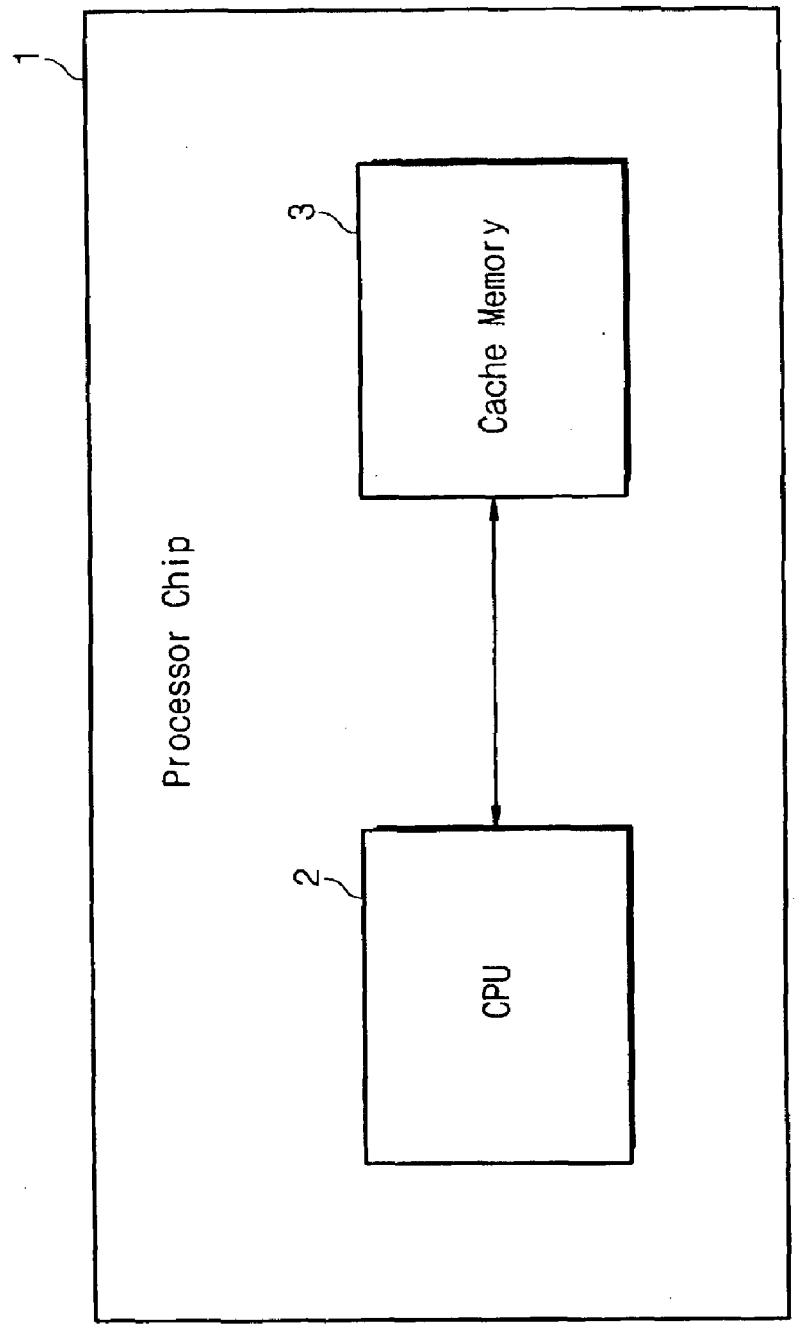
FIG. 1 illustrates a processor chip in which CPU and a cache memory are integrated in a single chip.
Figure 2:
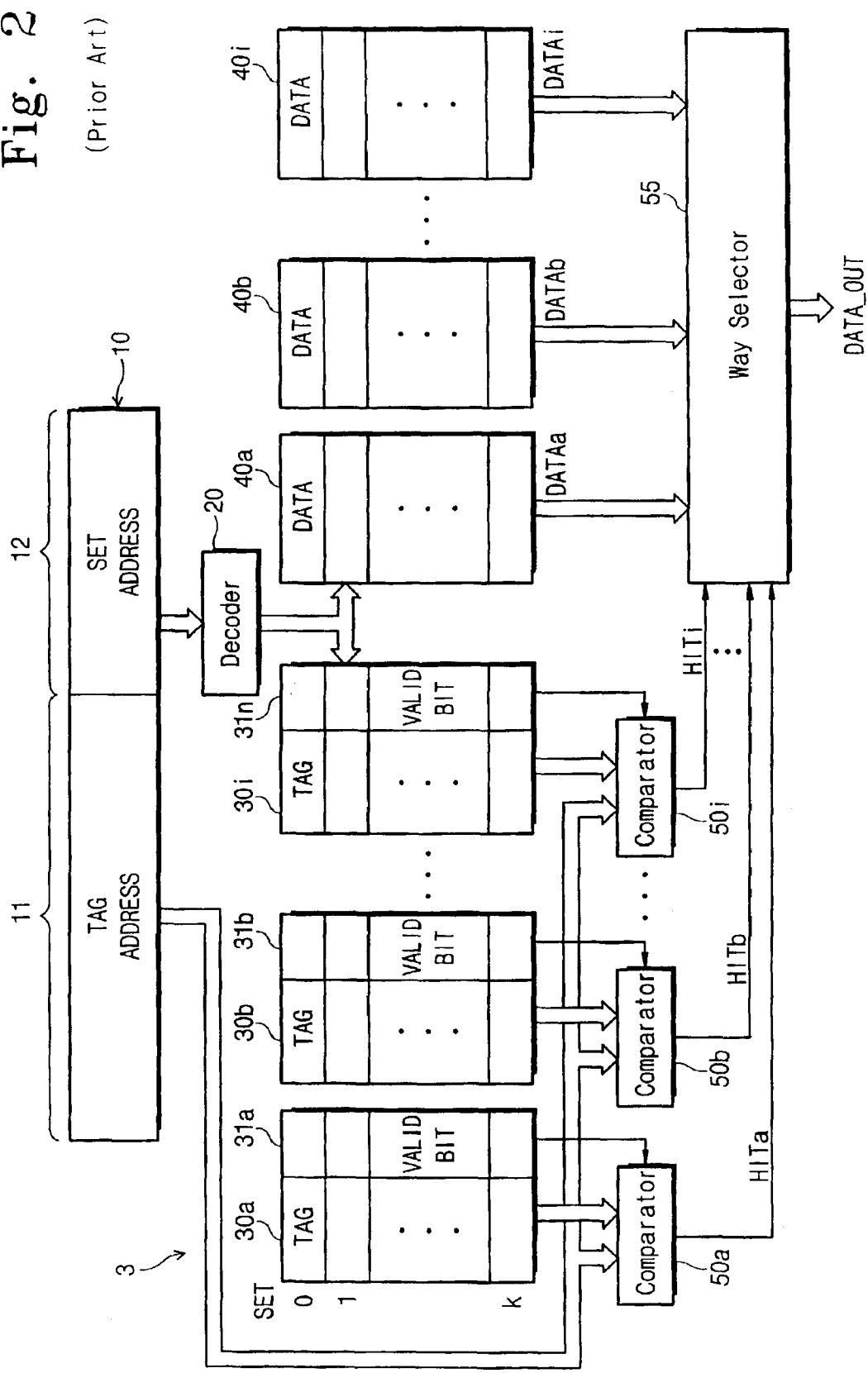
FIG. 2 illustrates an example of a multi-way set-associative cache memory.
Figure 3:
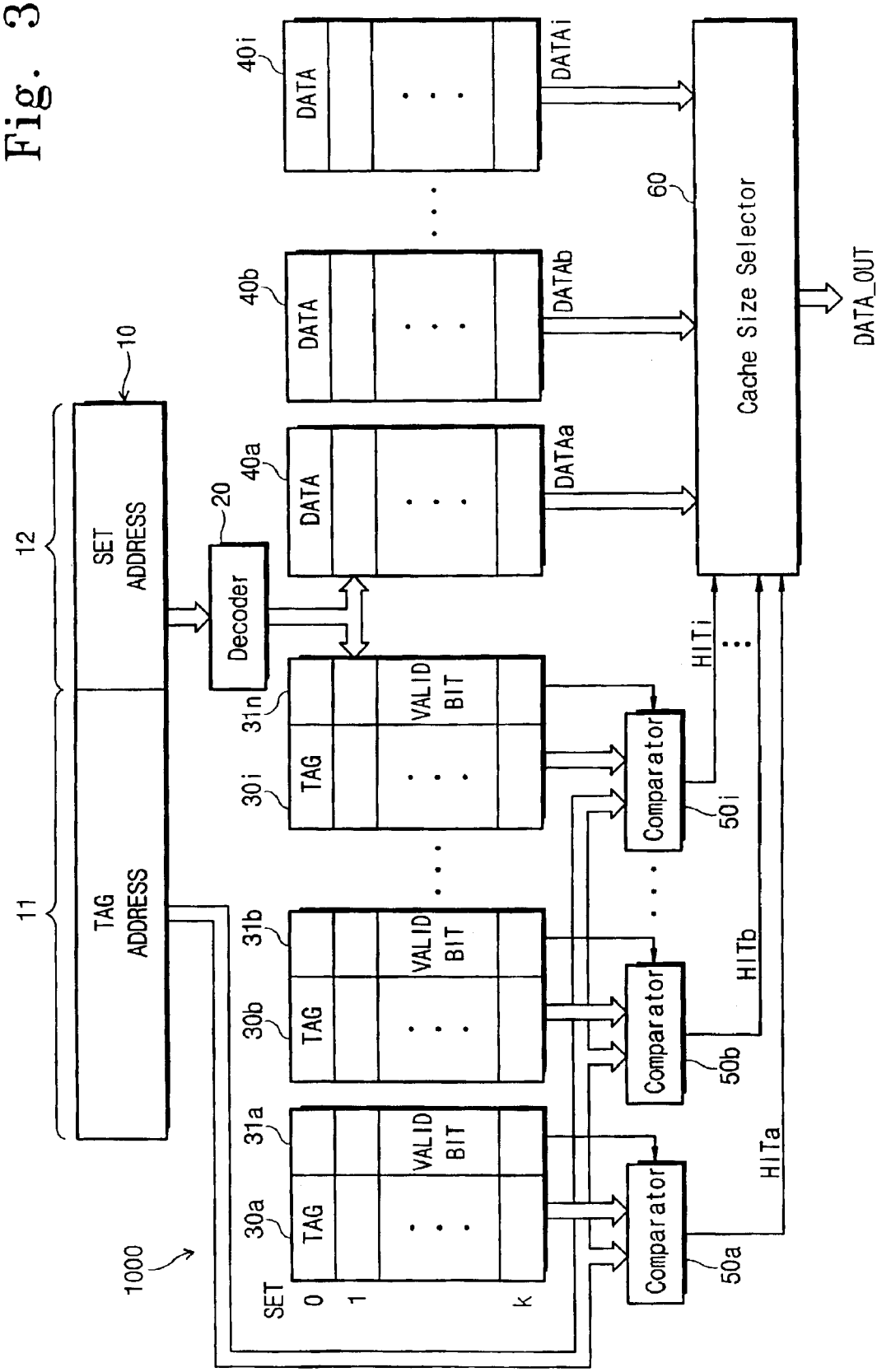
FIG. 3 is a multi-way set-associative cache memory according to a preferred embodiment of the present invention.
Figure 4:
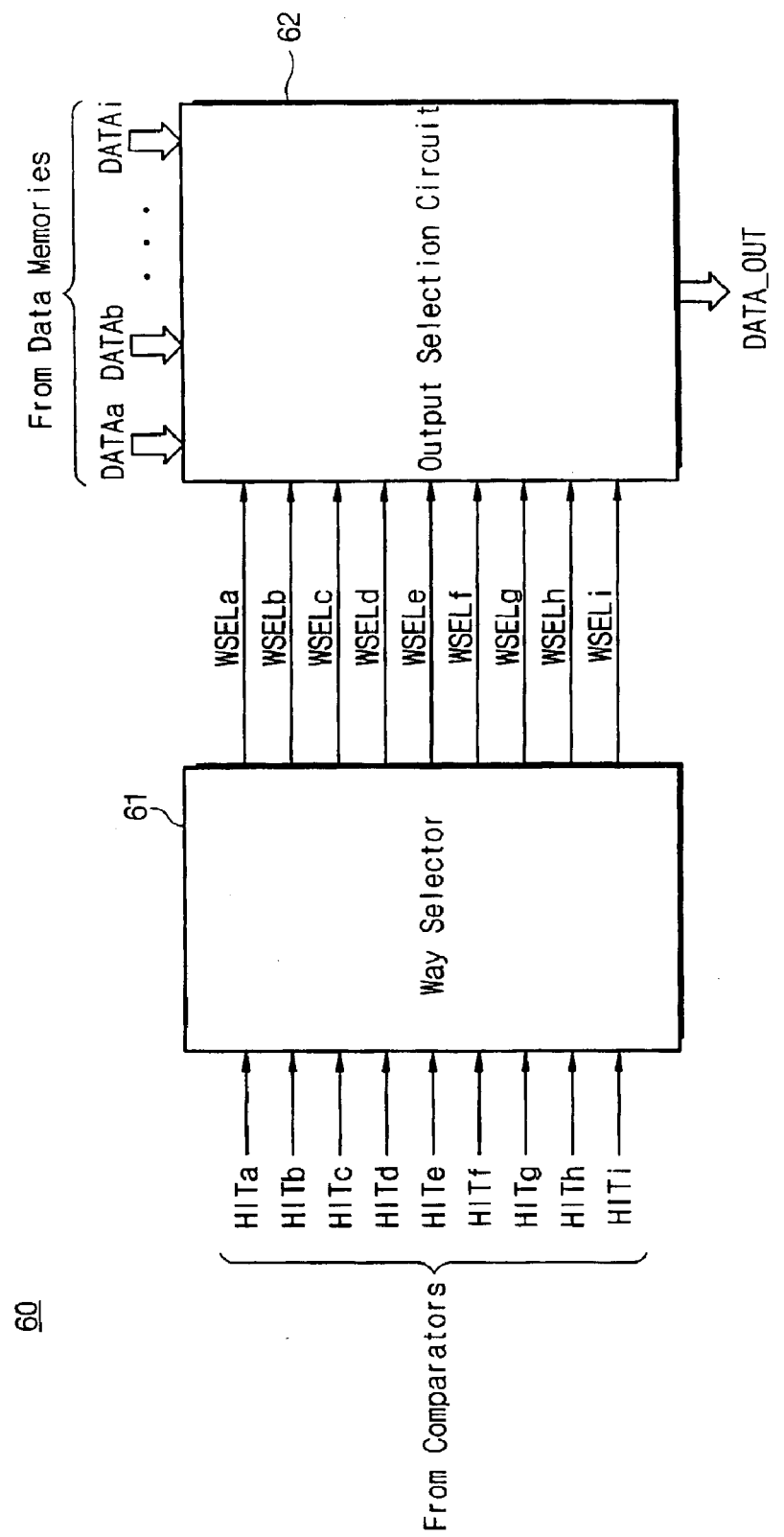
FIG. 4 is a block diagram of a cache size selector of FIG. 3 according to a preferred embodiment of the present invention.

FIG. 3 is a multi-way set-associative cache memory according to a preferred embodiment of the present invention and FIG. 4 is a block diagram of a cache size selector 60 of FIG. 3.

Referring to FIG. 4, the cache size selector 60 comprises a way selector 61 and an output selection circuit 62. The way selector 61 receives hit signals corresponding to defective tag memories among 9 hit signals HITa–HITi supplied from comparators 50a–50i according to a programmed state of following embedded fuse circuits, and generates the input hit signals as way selection signals WSELa–WSELi. The output selection circuit 62 selects and generates one of, or none of, data DATAa–DATAi supplied from data memories 40a–40i in response to the way selection signals WSELa–WSELi from the way selector 61. The detailed circuit configurations and operations of the way selector 61 and output selection circuit 62 will be described hereinafter.

Figure 5:
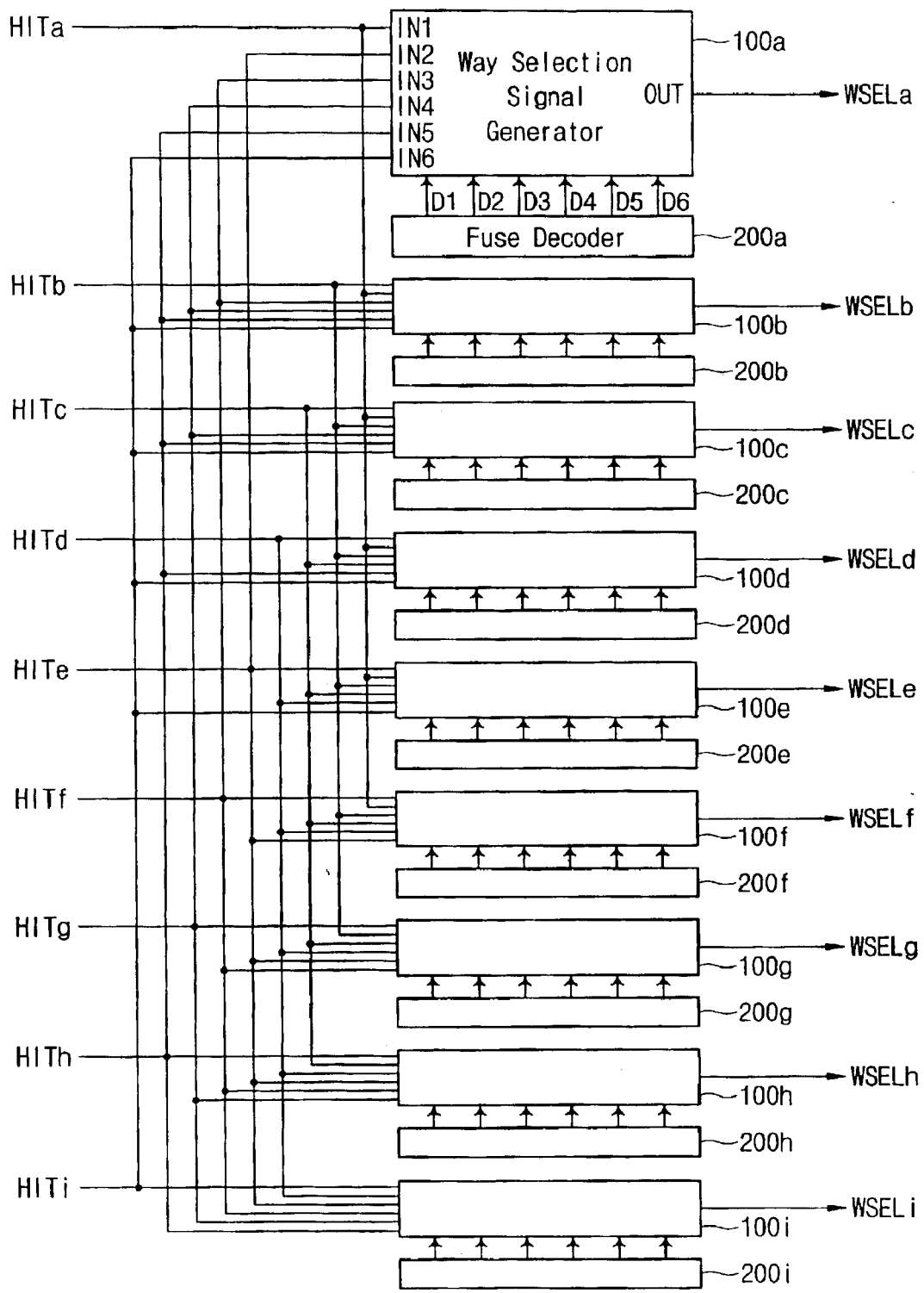
FIG. 5 illustrates a detailed circuit configuration of the way selector of FIG. 4.

FIG. 5 illustrates a detailed circuit configuration of a way selector 61 of FIG. 4.

Referring to FIG. 5, the way selector 61 comprises 9 way selection signal generators 100a–100i corresponding respectively to data memories 40a–40i and 9 fuse decoders 200a–200i corresponding respectively to the way selection signal generators 100a–100i.

Each of the way selection signal generators 100a–100i has 6 input terminals IN1–IN6 and a single output terminal OUT. Each way selection signal generator selects one of hit signals input from input terminals IN1–IN6 in response to decoding signals D1–D6 supplied from a corresponding fuse decoder 200a, 200b, ... , or 200i, and outputs the selected hit signal as a way selection signal WSEL0 or outputs a way selection signal WSEL0 at a low level.

The way selector 61 is provided such that if there is present a tag memory or data memory with defective cells among 9 ways of the cache memory 1000, normal operational memories excluding the tag memory or data memory with the defective cells are used. In particular, the way selector 61 of FIG. 5 is operated to use the cache memory 1000 as at least 4-way set-associative cache memory, when at most 5 tag memories of 9 tag memories 30a–30i and at most 5 data memories of 9 data memories are unavailable due to defective cells.

The number of input terminals of the way selection signal generators 100a–100i is calculated by the following Equation 1.

$$\begin{pmatrix} \text{THE NUMBER OF INPUT TERMINALS} \\ \text{OF WAY SELECTION SIGNAL GENERATOR} \end{pmatrix} = \\ \begin{pmatrix} \text{THE GREATEST WAY NUMBER} \\ \text{OF CASH MEMORIES} \end{pmatrix} - \\ \begin{pmatrix} \text{THE LEAST WAY NUMBER} \\ \text{OF CASH MEMORIES} \end{pmatrix} + 1$$

[Equation 1]

Here, "the greatest way number of cache memories" represents the total number of ways included in the cache memory 1000. At this time, there are not present defective cells, which cannot be replaced by remnant cells, in tag memories and data memories. In addition, "the least way number of cache memories" represents the least number of ways that can operate the cache memory 1000 using only non-defective tag memories and data memories even if there are present several defective cells in the tag memories and data memories included in the cache memory 1000.

In the present invention, a cache memory of which greatest way number is 9 and least way number is 4 will be explained as the preferred embodiment. However, the principles of the present invention are equally applicable to other cache size configurations. In this case, since the number of input terminals of each of way selection signal generators 100a–100i is (9–4+1), or 6, each way selection signal generator has 6 input terminals IN1–IN6. Different hit signals are input into the 6 input terminals IN1–IN6 included in a single way selection signal generator 100a, 100b, ... , or 100i. With respect to the example of FIG. 5, hit signals HITa, HITe, HITf, HITg, HITh, and HITi are respectively input in the input terminals IN1–IN6 of the way selection signal generator 100a, hit signals HITb, HITa, HITf, HITg, HITh, and HITi are respectively input in the input terminals of the way selection signal generator 100b, hit signals HITc, HITa, HITb, HITg, HITh, and HITi are respectively input in the input terminals of the way selection signal generator 100c, hit signals HITd, HITa, HITb, HITc, HITh, and HITi are respectively input in the input terminals of the way selection signal generator 100d, hit signals HITe, HITa, HITb, HITc, HITd, and HITi are respectively input in the input terminals of the way selection signal generator 100e, hit signals HITf, HITa, HITb, HITc, HITd, and HITe are respectively input in the input terminals of the way selection signal generator 100f, hit signals HITg, HITb, HITc, HITd, HITe, and HITf are respectively input in the input terminals of the way selection signal generator 100g, hit signals HITh, HITc, HITd, HITe, HITf, and HITg are respectively input in the input terminals of the way selection signal generator 100h, and hit signals HITi, HITd, HITe, HITf, HITg, and HITh are respectively input in the input terminals IN1–IN6 of the way selection signal generator 100i.

Each of the hit signals HITa–HITi output from the comparators 50a–50i is input into the 6 way selection signal generators 100a–100i. The way selector 61 of FIG. 5 shows that the hit signals HITa–HITi are input into the way selection signal generators 100a–100i according to the most preferred method. However, the way selector 61 is capable of a number of different configurations for connecting the hit signals HITa–HITi to input terminals IN1–IN6 of each of the way selection signal generators 100a–100i.

Figure 6:
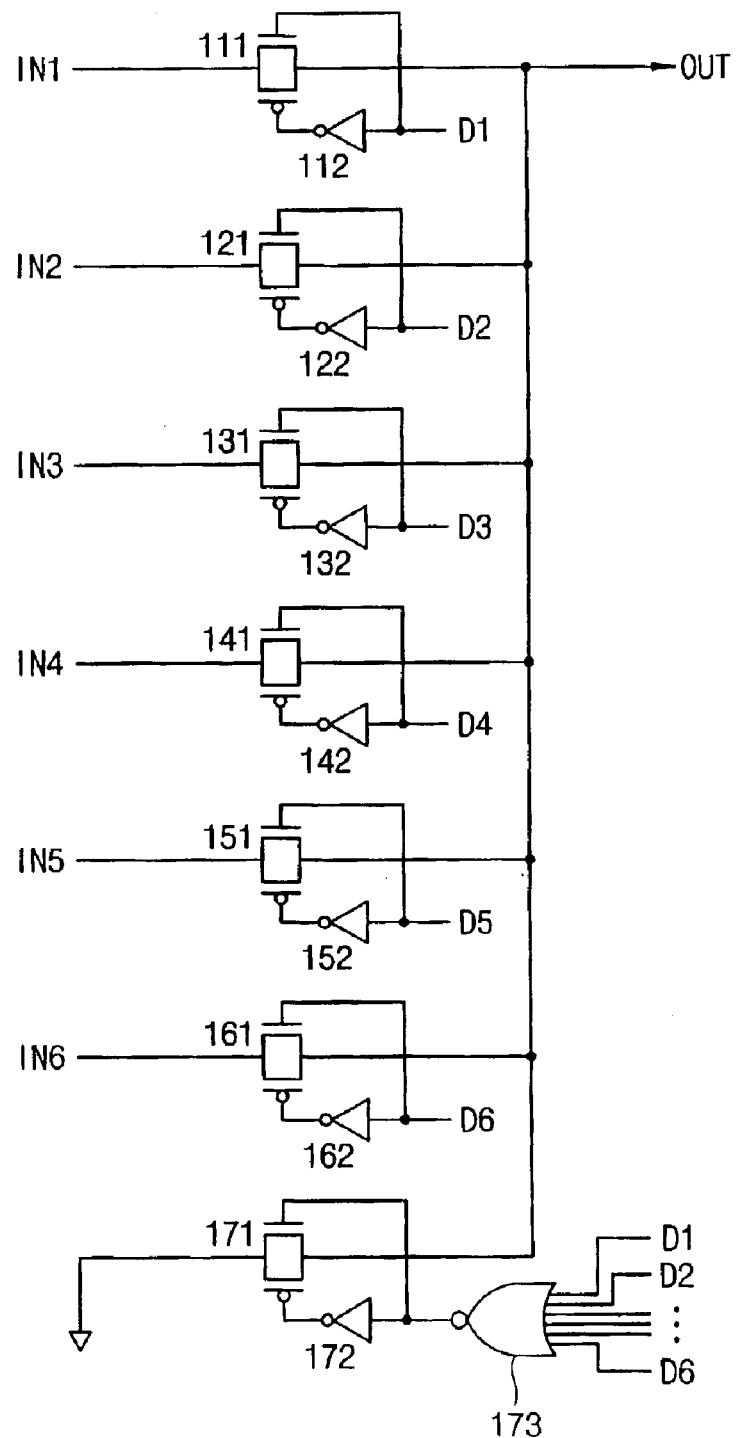
FIG. 6 illustrates a detailed circuit configuration of way selection signal generators of FIG. 5.
Figure 7:
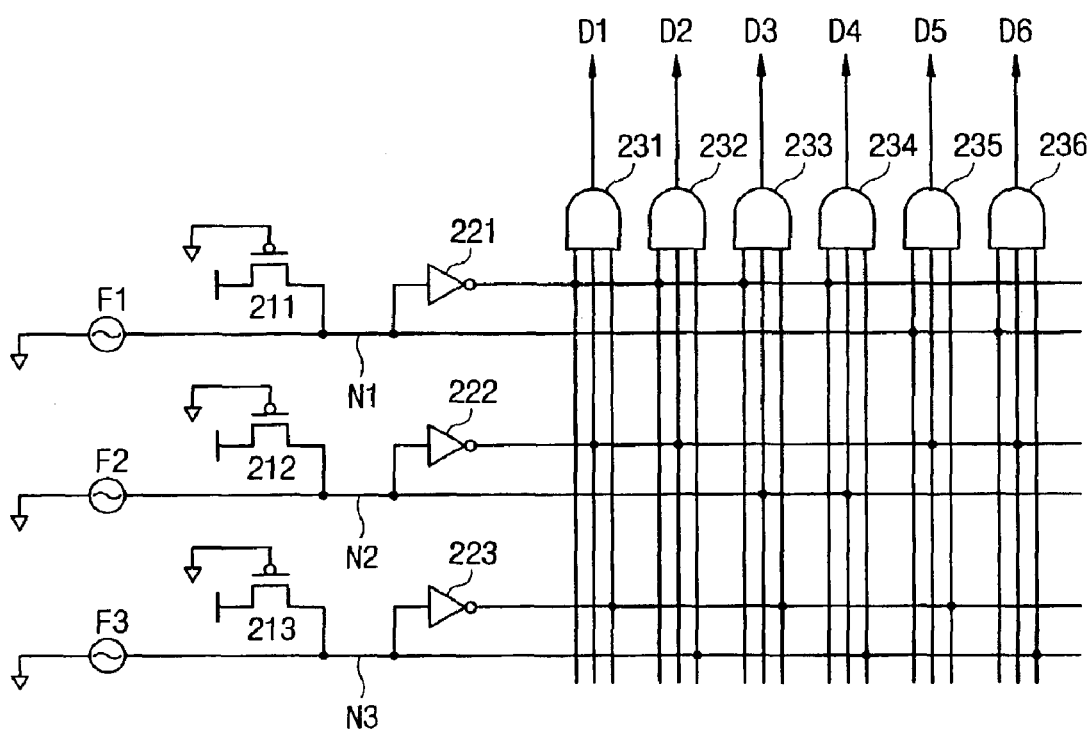
FIG. 7 illustrates a detailed circuit configuration of the fuse decoder of FIG. 5.

Referring to FIGS. 6 and 7, detailed circuit configurations and operations of the way selection signal generators 100a–100i and the fuse decoders 200a–200i will be explained. FIG. 6 illustrates the detailed circuit configuration of the way selection signal generator 100a of FIG. 5, and FIG. 7 illustrates the detailed circuit configuration of the fuse decoder 200a of FIG. 5. The other way selection signal generators 100b–100i have the same circuit configuration as the way selection signal generator 100a, and the other fuse decoders 200b–200i have the same circuit configuration as the fuse decoder 200a.

To begin with, referring to FIG. 6, the way selection signal generator 10 comprises transmission gates 111–161 and inverters 112–162, which respectively correspond to input terminals IN1–IN6, a transmission gate 171, an inverter 172, and a NOR gate 173. The inverter 112 has an input terminal for receiving a decoding signal D1 supplied from the decoder 200a as well as an output terminal. The transmission gate 111 is formed of an NMOS transistor and a PMOS transistor, and current paths of transistors are formed between the input and output terminals IN1 and OUT. A gate of the PMOS transistor is coupled to an output terminal of the inverter 112, and a gate of the NMOS transistor is coupled to the decoding signal D1. Therefore, when the decoding signal D1 is at a high level (i.e. logic '1'), a signal input via the input terminal IN1 is transferred to the output terminal OUT.

Similarly to the coupled of the transmission gate 111 and the inverter 112, the other transmission gates 121–161 and inverters 122–162 are likewise coupled to each other. Thus, the way selection signal generator 100a outputs a signal to the output terminal OUT, which is input via the input terminal IN1, IN2, . . . , or IN6 corresponding to the decoding signal that is a high level among the decoding signals D1–D6.

The NOR gate 173 receives the decoding signals D1–D6. The inverter 172 has an input terminal for receiving an output signal from the NOR gate 173 as well as an output terminal. The transmission gate 171 is formed of an NMOS transistor and a PMOS transistor, and current paths of transistors are formed between a ground voltage and the output terminal OUT. A gate of the PMOS transistor is coupled to the output terminal of the inverter 172, and a gate of the NMOS transistor is coupled to the output terminal of the NOR gate 173. Therefore, when all the decoding signals D1–D6 are at a low level (i.e. logic '0'), the output terminal OUT is coupled to the ground voltage.

Referring to FIG. 7, the fuse decoder 200a comprises fuses F1, F2, and F3, PMOS transistors 211–213, inverters 221–223, and AND gates 231–236. The fuse F1 has one end coupled to the ground voltage and the other end coupled to a first node N1. The PMOS transistor 211 has a current path formed between the ground voltage and the first node N1 as well as a gate coupled to the ground voltage. The inverter 221 has an input terminal coupled to the first node N1 and an output terminal. The fuse F2 has one end coupled to the ground voltage and the other end coupled to a second node N2. The PMOS transistor 212 has a current path formed between a power supply voltage and the second node N2 as well as a gate coupled to the ground voltage. The inverter 222 has an input terminal coupled to the second node N2 and an output terminal. The fuse F3 has one end coupled to the ground voltage and the other end coupled to a third node N3. The PMOS transistor 213 has a current path formed between the power supply voltage and the third node N3 as well as a gate coupled to the ground voltage. The inverter 223 has an input terminal coupled to the third node N3 and an output terminal.

The AND gate 231 includes input terminals being respectively connected to output terminals of the inverters 221, 222, and 223 as well as an output terminal for outputting the decoding signal D1. The AND gate 232 includes input terminals being respectively connected to output terminals of the inverters 221 and 222 and the third node N3 as well as an output terminal for outputting the decoding signal D2. The AND gate 233 includes input terminals being respectively connected to the output terminals of the inverters 221 and 223 and the second node N2 as well as an output terminal for outputting the decoding signal D3. The AND gate 234 includes input terminals being respectively connected to the output terminal of the inverter 221 and the second and third nodes N2 and N3 as well as an output terminal for outputting the decoding signal D3. The AND gate 235 includes input terminals being respectively connected to the output terminals of the inverters 222 and 223 as well as an output terminal for outputting the decoding signal D5. Also, the AND gate 236 has input terminals being respectively connected to the first and third nodes N1 and N3 and the output terminal of the inverter 222 as well as an output terminal for outputting the decoding signal D6.

The fuse decoder 200a having the foregoing configuration activates only one of the decoding signals D1–D6 at a high level or inactivates all the decoding signals D1–D6 at a low level according to whether or not the fuses F1, F2, and F3 are cut.

FIG. 8 shows decoding signals activated among the decoding signals D1–D6 output from the AND gates 231–236 according to program states (i.e. cutting or not) of the fuses F1, F2, and F3 of FIG. 7. In FIG. 8, '1' represents that fuses are cut, and '0' represents that fuses are not cut.

Referring to FIGS. 7 and 8, for example, when all the fuses F1, F2, and F3 are not cut, a current path is formed between the power supply voltage and the ground voltage via each of the fuses F1, F2, and F3 such that the first, second, and third nodes N1, N2, and N3 all go to a low level. As a result, only the decoding signal D1 output from the AND gate 231 is activated at a high level while decoding signals D2–D6 output from the other AND gates 232–236 are inactivated at a low level. For another example, if only the fuse F3 is cut and the other fuses F1 and F2 are not cut, the third node N3 coupled to the cut fuse F3 goes to a high level by the PMOS transistor 212, and the first and second nodes N1 and N2 coupled to the other fuses F1 and F2 go to a low level. As a result, only the decoding signal D2 output from the AND gate 232 is activated at a high level while the decoding signals D1 and D3–D6 output from the other AND gates 231 and 233–236 are inactivated at a low level. If all the fuses F1, F2, and F3 are cut or the fuses F1 and F2 are cut, all the decoding signals D1–D6 output from the AND gates 231–236 are inactivated at a low level.

If the fuses included in each of the fuse decoders 200a–200i of FIG. 5 are programmed as explained above, the size of the cache memory may be selected. A method for selecting a size of the cache memory will be explained in more detail hereinafter.

Figure 9A:
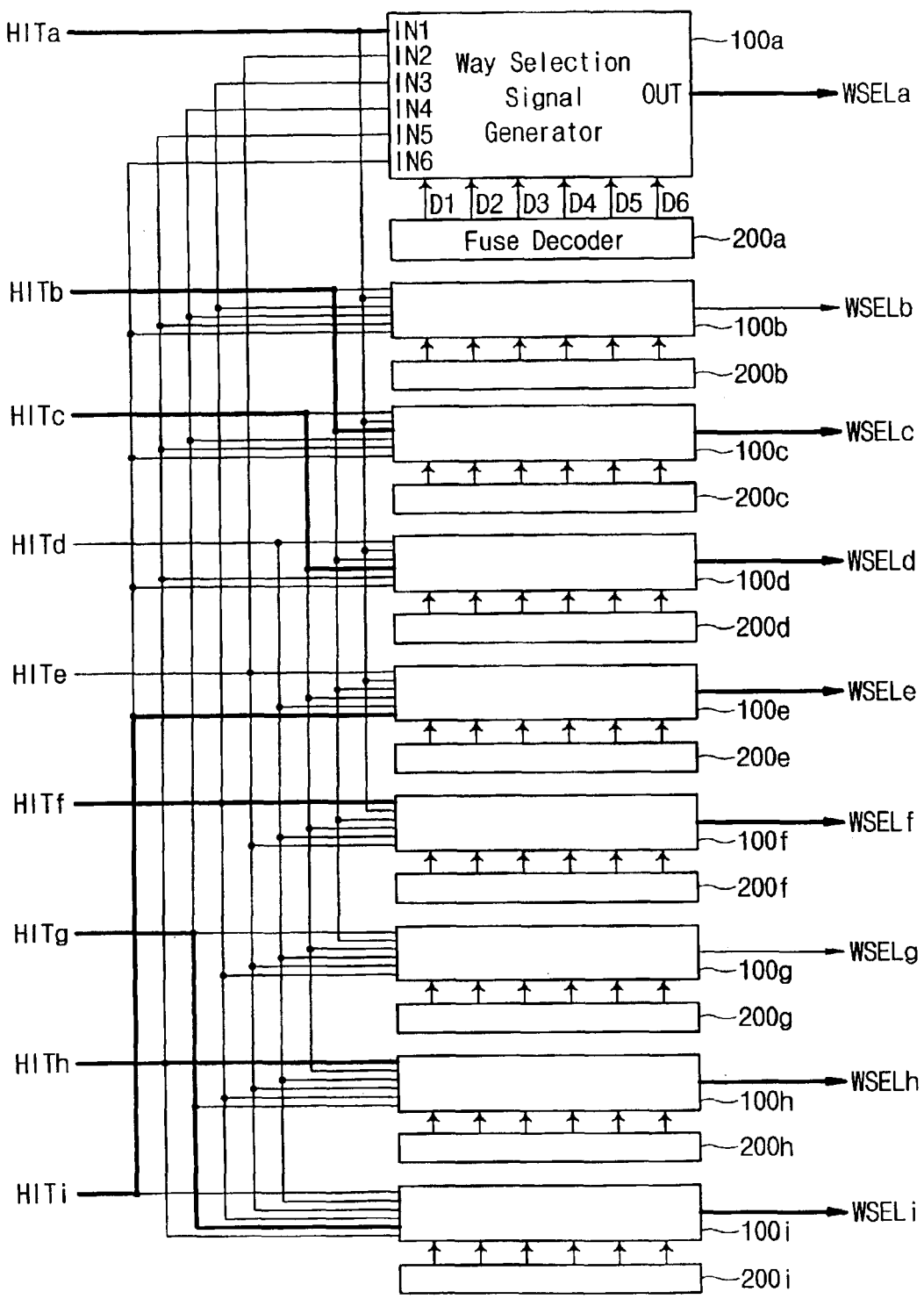
FIG. 9A exemplarily illustrates signals being input/output into/from the way selector of FIG. 5, in the case where defective cells are present in 2 tag memories and 2 data memories, respectively, wherein the cache size is changed from 9-way set-associative cache memory to 7-way set-associative cache memory.

FIG. 9A exemplarily illustrates a method for selecting and changing a size from 9-way set-associative cache memory to 7-way set-associative cache memory when defective cells are present in 2 tag memories and 2 data memories, respectively. FIG. 9B, as illustrated in FIG. 9A, shows a program state of each of the fuses F1–F3 of the fuse decoders 200a–200i, states of the decoding signals D1–D6 thereof, and a selected input terminal of each of way selection signal generators 100a–100i when the 9-way cache memory is changed to operate as a 7-way cache memory.

Referring to FIGS. 9A and 9B, when there are present defective cells in each of 2 tag memories 30d and 30e and 2 data memories 40b and 40g, the fuses F1, F2, and F3 are programmed in the fuse decoders 200a–200i so as not to use the tag memories 30d and 30e and the data memories 40b and 40g with defective cells. If the fuse decoders 200a–200i are programmed as illustrated in FIG. 9B, the way selection signal generator 100a outputs as a way selection signal WSELa the hit signal HITa input via the input terminal IN1, the way selection signal generator 100c outputs as a way selection signal WSELc the hit signal HITb input via the input terminal IN3, the way selection signal generator 100d outputs as a way selection signal WSELd the hit signal HITc input via the input terminal IN4, the way selection signal generator 100e outputs as a way selection signal WSELe the hit signal HITi input via the input terminal IN6, the way selection signal generator 100f outputs as a way selection signal WSELf the hit signal HITf input via the input terminal IN1, the way selection signal generator 100h outputs as a way selection signal WSELh the hit signal HITh input via the input terminal IN1, and the way selection signal generator 100i outputs as a way selection signal WSELi the hit signal HITg input via the input terminal IN5. Meanwhile, the way selection signal generator 100b and the way selection signal generator 100g receive none of signals input via the input terminals IN1–IN6 and way selection signals WSELb and WSELg are therefore generated at a low level, respectively. Therefore, the tag memories 30d and 30e and the data memories 40b and 40g having defective cells are not used.

In the cache memory 1000 having the foregoing configuration, for example, when the comparator 50b determines that the contents stored in the tag memory 30b are identical with the tag address 11 and the hit signal HITb is output at a high level, a way selection signal WSELc is generated by the way selection signal generator 100c. Thus, the output selection circuit 62 outputs data DATAc from the data memory 40c to the CPU 2.

In another example, if the comparator 50i determines that the contents stored in the tag memory 30i are identical with the tag address 11 and a hit signal HITi is output at a high level, the way selection signal WSELe is generated by the way selection signal generator 100e. As a result, the output selection circuit 62 outputs data DATAe from the data memory 40e to the CPU 2.

According to the present invention, among the tag memories 30a–30i and the data memories 40a–40i, the remaining tag memories 30a–30c and 30f–30i and data memories 40a, 40c–40f, 40h, and 40i excluding the tag memories 30d and 30e and data memories 40b and 40g with defective cells are used to embody a cache memory of which size is scaled down and may be normally operated.

Figure 10A:
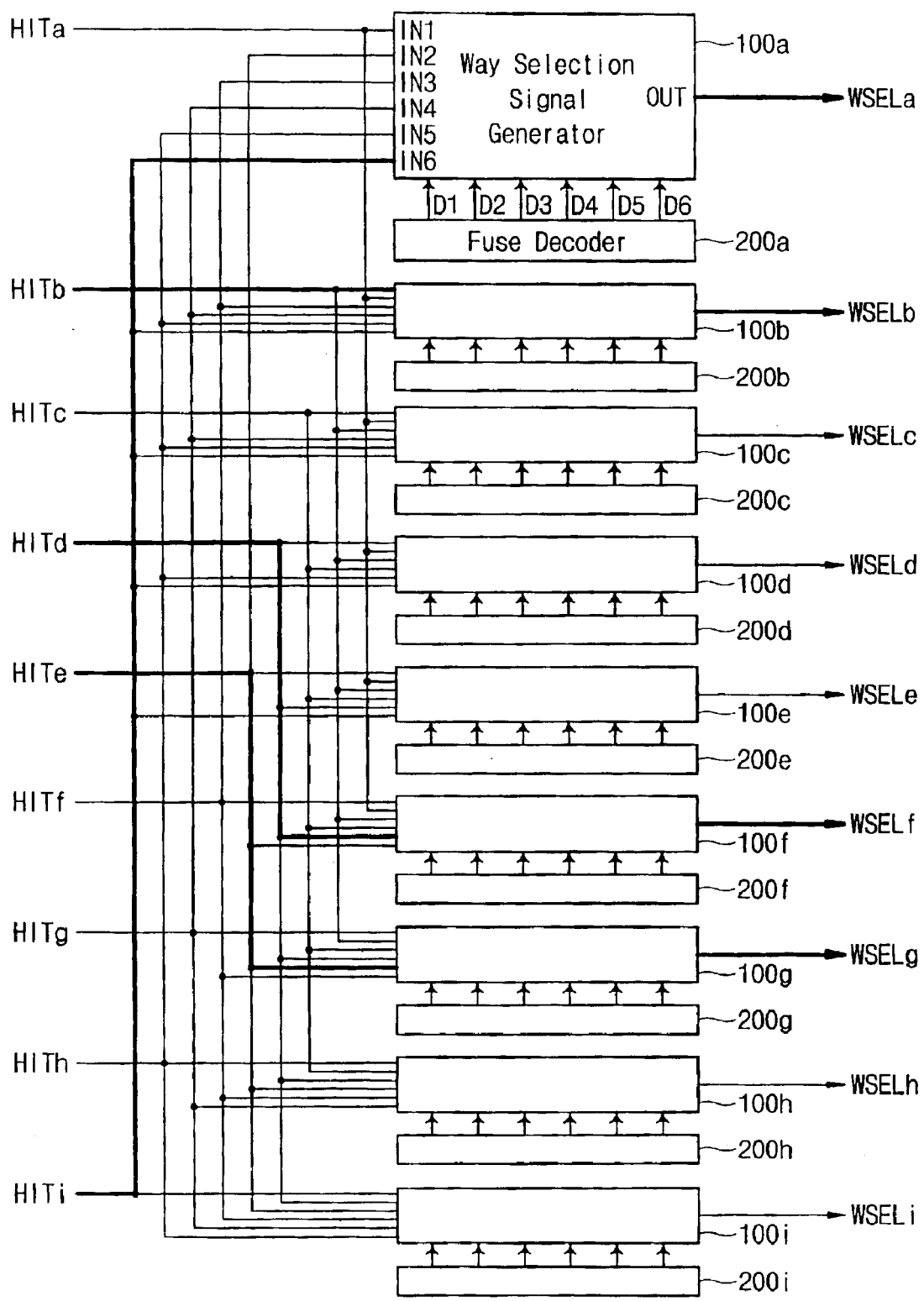
FIG. 10A exemplarily illustrates signals input/output into/from the way selector of FIG. 5, in the case where defective cells are present in 5 tag memories and 5 data memories, respectively, and wherein the cache size is changed from 9-way set-associative cache memory to 4-way set-associative cache memory.

FIG. 10A exemplarily illustrates a method for selecting and changing a size from 9-way set-associative cache memory to 4-way set-associative cache memory when it is determined that defective cells are present in 5 tag memories and 5 data memories, respectively. FIG. 10B, as illustrated in FIG. 10A, shows a program state of each of the fuses F1–F3 of the fuse decoders 200a–200i, states of the decoding signals D1–D6 thereof, and a selected input terminal of each of way selection signal generators 100a–100i when the 9-way cache memory is changed to the 4-way cache memory.

Referring to FIGS. 10A and 10B, when defective cells are present in each of the 5 tag memories 30a, 30c, 30f, 30g, and 30h and 5 data memories 40c, 40d, 40e, 40h, and 40i, fuses F1, F2, and F3 in the fuse decoders 200a–200i are programmed so as not to use the tag memories 30a, 30c, 30f, 30g, and 30h and data memories 40c, 40d, 40e, 40h, and 40i having defective cells. If the fuse decoders 200a–200i are programmed as illustrated in FIG. 10B, the way selection signal generator 100a outputs as a way selection signal WSELa the hit signal HITi input via the input terminal IN6, the way selection signal generator 100b outputs as a way selection signal WSELb the hit signal HITB input via the input terminal IN1, the way selection signal generator 100f outputs as a way selection signal WSELf the hit signal HITd input via the input terminal IN1, and the way selection signal generator 100g outputs as a way selection signal WSELg the hit signal HITe input via the input terminal IN1. Meanwhile, the way selection signal generators 100c, 100d, 100e, 100h, and 100i, which correspond to the data memories 40c, 40d, 40e, 40h, and 40i with defective memory cells, receive none of signals input via the input terminals IN1–IN6. According to the foregoing configuration, the tag memories 30a, 30c, 30f, 30g, and 30h and the data memories 40c, 40d, 40e, 40h, and 40i having defective cells are not used.

In the cache memory 1000 having the foregoing configuration, for example, when the comparator 50d determines that the contents stored in the tag memory 30d are identical with the tag address 11 and the hit signal HITd is output at a high level, a way selection signal WSELf is generated by the way selection signal generator 100f. Thus, the output selection circuit 62 outputs data DATAf from the data memory 40f to the CPU 2.

In another example, if the comparator 50i determines that the contents stored in the tag memory 30i are identical with the tag address 11 and a hit signal HITi is output at a high level, the way selection signal WSELa is generated by the way selection signal generator 100a. As a result, the output selection circuit 62 outputs data DATAa from the data memory 40a to the CPU 2.

According to the present invention, among the tag memories 30a–30i and the data memories 40a–40i, the remaining tag memories 30b, 30d, 30e, and 30i and data memories 40a, 40b, 40f, and 40g excluding the tag memories 30a, 30c, 30f, 30g, and 30h and data memories 40c, 40d, 40e, 40h, and 40i with defective cells are used to embody a cache memory of which size is scaled down and may be normally operated.

If 3 tag memories of the tag memories 30a–30i have defective cells and 1 data memory of the data memories 40a–40i have defective cells, because normal tag memories and data memories should one-to-one correspond to each other, two of the normal data memories would no be used. That is, 6 tag memories and 6 data memories without defective cells should correspond to each other on a one-to-one basis.

While the present preferred embodiment has been illustrated and described in connection with 9-way set-associative cache memory 1000, it is capable of application to multi-way set-associative cache memory and of various changes in the least way number as would be apparent to those skilled in the art. As set forth above, the number of input terminals of way selection signal generators is determined by the greatest way number and the least way number of the cache memory. Therefore, the scope of the appended claims, which define the invention, should be accorded the broadest interpretation so as to encompass all such modifications and similar structures.

According to the present invention as described above, when there are present incurably defective cells in tag and data memories of a multi-way set-associative cache memory, those normally operational ways of the tag and data memories are selected and used, while excluding the ways of the tag and data memories with defective cells. By changing to a small-size cache memory, it is capable of preventing scraping or discarding of the entire high-priced processor chip in which CPU and a cache memory are integrated in a single chip due to several defective cells of the cache memory.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A data processing system comprising:

a processor; and a multi-way set-associative cache memory for storing data to be used by the processor, wherein the cache memory comprises:

a data memory being divided into a plurality of data ways, the data memory for storing data to be used by the processor;

a tag memory being divided into a plurality of tag ways, the tag memory for storing a tag address; and a cache size selector for selecting for operation those data ways among the plurality of data ways of the data memory and those tag ways among the plurality of tag ways of the tag memory that are determined to function normally, and excluding from operation those data ways among the plurality of data ways of the data memory and those tag ways among the plurality of tag ways of the tag memory having defective memory cells, the number of selected data ways of data memory being equal to the number of selected tag ways of tag memory, wherein the cache size selector receives a plurality of hit signals, each hit signal from a corresponding tag way, and outputs a plurality of selection signals, each selection signal corresponding to a data way, and wherein the cache size selector further comprises a selection signal designator that designates one hit signal among the plurality of hit signals from the corresponding selected tag ways for output as a selection signal for each of the plurality of selection signals corresponding to a selected data way.

2. The data processing system as claimed in claim 1, further comprising comparing means for respectively comparing a predetermined address from the processor with tag addresses stored in the selected tag ways of the tag memory to output the hit signals that respectively represent whether or not the predetermined address is consistent with the tag address stored in each tag way of the tag memory, wherein the cache size selector receives the hit signals from the corresponding selected tag ways of the tag memory and designates the hit signals for output as selection signals corresponding to the selected data ways of the data memory.

3. The data processing system as claimed in claim 1, wherein the selection signal designator of the cache size selector comprises:

a first selection circuit for receiving the hit signals corresponding to the selected tag ways of the tag memory and for outputting the plurality of selection signals corresponding respectively to data ways of the data memory, wherein the selection signals select one of the selected data ways of the data memory; and a second selection circuit for supplying the processor with the data stored in one of the ways of the data memory according to the selection signals.

4. The data processing system as claimed in claim 3, wherein the second selection circuit supplies the processor with none of the data stored in the data memory when all the hit signals indicate that the predetermined address is not consistent with the tag address stored in a corresponding tag way of the tag memory.

5. The data processing system as claimed in claim 3, wherein the first selection circuit comprises a plurality of selection signal generating circuits corresponding respectively to data ways of the data memory, the selection signal generating circuits for selectively receiving one of the hit signals corresponding to the selected ways of the tag memory and for outputting the selected signal for selecting a data way corresponding to the data memory.

6. The data processing system as claimed in claim 5, wherein each of the selection signal generating circuits selectively receives one of the hit signals corresponding to the selected tag ways of the tag memory when a corresponding data way of the data memory is selected, and each of the selection signal generating circuits receives none of the hit signals and does not output the selection signal when the corresponding data way of the data memory is not selected.

7. The data processing system as claimed in claim 5, wherein each of the selection signal generating circuits receives a different hit signal.

8. The data processing system as claimed in claim 5, wherein each of the selection signal generating circuits comprises:

input terminals for receiving the hit signals corresponding to the selected tag ways of the tag memory;

storing means for storing information as to whether one of or none of the hit signals are received from the comparing means;

a decoder for decoding the information stored in the storing means to output decoding signals; and a selection signal generator for receiving one of the hit signals input via the input terminals to output the selected signal or for receiving none of the hit signals such that the selected signal is not output, in response to the decoding signals.

9. The data processing system as claimed in claim 8, wherein the storing means comprises at least one fuse.

10. The data processing system as claimed in claim 8, wherein the number of the input terminals is a number obtained by adding 1 to a difference between the maximum selectable way number and the minimum selectable way number of the data and tag memories.

11. The data processing system as claimed in claim 1, wherein the selection signal designator designates the one hit signal among the plurality of hit signals for output as a selection signal in response to a programming signal.

12. A data processing system comprising:

a processor; and a multi-way set-associative cache memory for storing data to be used by the processor, wherein the cache memory comprises:

a data memory being divided into a plurality of data ways, the data memory for storing data to be used by the processor;

a tag memory being divided into a plurality of tag ways, the tag memory for storing a tag address;

comparing means for respectively comparing a predetermined address from the processor with tag addresses stored in tag ways of the tag memory and for outputting a plurality of hit signals that respectively represent whether or not the predetermined address is identical with the tag address stored in each tag way of the tag memory; and a cache memory size selection circuit for selecting for operation the hit signals corresponding to a portion of the tag ways of the tag memory and a portion of the data ways of the data memory, the number of selected hit signals being equal to the number of selected data ways of the data memory, wherein the cache memory size selection circuit receives the plurality of hit signals, each hit signal from a corresponding tag way, and outputs a plurality of selection signals, each selection signal corresponding to a data way, and wherein the cache memory size selection circuit further comprises a selection signal designator that designates one hit signal among the plurality of hit signals from the corresponding selected tag ways for output as a selection signal for each of the plurality of selection signals corresponding to a selected data way.

13. The data processing system as claimed in claim 12, wherein the cache memory size selection circuit respectively selects for operation those data ways among the plurality of data ways of the data memory and those tag ways among the plurality of tag ways of the tag memory that are determined to function normally, and excluding from operation those ways among the plurality of ways of the data memory and those tag ways among the plurality of tag ways of the tag memory having defective memory cells.

14. The data processing system as claimed in claim 13, wherein the selection signal designator of the cache memory size selection circuit comprises:
   a plurality of selection signal generating circuits corresponding respectively to the data ways of the data memory, the selection signal generating circuits each receiving one of the hit signals corresponding to the normally functioning tag ways of the tag memory to output the selection signal for selecting a data way corresponding respectively to the data memory; and
   an output circuit for supplying the processor with the data stored in the data way of the data memory selected by the selection signals.

15. The data processing system as claimed in claim 14, wherein the output circuit supplies the processor with none of data stored in the data memory when all the hit signals indicate that the predetermined address is not identical with the tag address stored in the tag way corresponding to the tag memory.

16. The data processing system as claimed in claim 14, wherein each of the selection signal generating circuits receives one of the hit signals corresponding to the selected tag ways of the tag memory when the data way corresponding to the data memory is selected, and each of the selection signal generating circuits receives none of the hit signals and does not output the selection signal when the way corresponding to the data memory is not selected.

17. The data processing system as claimed in claim 14, wherein each of the selection signal generating circuits receives a different hit signal.

18. The data processing system as claimed in claim 14, wherein each of the selection signal generating circuits comprises:
   input terminals for receiving the hit signals corresponding to the selected tag ways of the tag memory;
   storing means for storing information as to whether one of the hit signals is received from the comparing means;
   a decoder for decoding the information stored in the storing means to output decoding signals; and
   a selection signal generator for selecting one of the hit signals input via the input terminals to be output as the selection signal or for selecting none of the hit signals such that the selection signal is not output, in response to the decoding signals.

19. The data processing system as claimed in claim 18, wherein the storing means comprises at least one fuse.

20. The data processing system as claimed in claim 18, wherein the number of the input terminals is a number obtained by adding 1 to a difference between the maximum selectable way number and the minimum selectable way number of the data and tag memories.

21. The data processing system as claimed in claim 12, wherein the selection signal designator designates the one hit signal among the plurality of hit signals for output as a selection signal in response to a programming signal.

22. A multi-way set-associative cache memory comprising:
   a data memory being divided into a plurality of data ways, the data memory for storing data to be used by the processor;
   a tag memory being divided into a plurality of tag ways, the tag memory for storing a tag address; and
   a cache size selector for selecting for operation those data ways among the plurality of data ways of the data memory and those tag ways among the plurality of tag ways of the tag memory that are determined to function normally, and excluding from operation those data ways among the plurality of data ways of the data memory and those tag ways among the plurality of tag ways of the tag memory having defective memory cells, the number of selected data ways of data memory being equal to the number of selected tag ways of tag memory, wherein the cache size selector receives a plurality of hit signals, each hit signal from a corresponding tag way, and outputs a plurality of selection signals, each selection signal corresponding to a data way, and wherein the cache size selector further comprises a selection signal designator that designates one hit signal among the plurality of hit signals from the corresponding selected tag ways for output as a selection signal for each of the plurality of selection signals corresponding to a selected data way.

23. The multi-way set-associative cache memory as claimed in claim 22, further comprising comparing means for respectively comparing a predetermined address from the processor with tag addresses stored in the selected tag ways of the tag memory to output hit signals that respectively represent whether or not the predetermined address is identical with the tag address stored in each tag way of the tag memory,
   wherein the cache size selector receives the hit signals from the selected tag ways of the tag memory and corresponds the hit signals to the selected data ways of the data memory.

24. The multi-way set-associative cache memory as claimed in claim 23, wherein the selection signal designator of the cache size selector comprises:
   a first selection circuit for receiving the hit signals corresponding to the selected tag ways of the tag memory and for outputting the plurality of selection signals corresponding respectively to the data ways of the data memory, wherein the selection signals select one of the selected data ways of the data memory; and
   a second selection circuit for supplying the processor with the data stored in one of the data ways of the data memory according to the selection signals.

25. The multi-way set-associative cache memory as claimed in claim 24, wherein the second selection circuit supplies the processor with none of the data stored in the data memory when all the hit signals indicate that the predetermined address is not identical with the tag address stored in the tag way corresponding to the tag memory.

26. The multi-way set-associative cache memory as claimed in claim 24, wherein the first selection circuit comprises a plurality of selection signal generating circuits corresponding respectively to the data ways of the data memory, the plurality of the selection signal generating circuits each selectively receiving one of the hit signals corresponding to the selected tag ways of the tag memory and for outputting the selection signals for selecting the data way corresponding to the data memory.

27. The multi-way set-associative cache memory as claimed in claim 26, wherein each of the selection signal generating circuits receives a different hit signal.

28. The multi-way set-associative cache memory as claimed in claim 26, wherein each of the selection signal generating circuits comprises:
   input terminals for receiving the hit signals corresponding to the selected tag ways of the tag memory;
   storing means for storing the information as to whether one of the hit signals is received from the comparing means;
   a decoder for decoding the information stored in the storing means to output decoding signals; and
   a selection signal generator for selecting one of the hit signals input via the input terminals to output as the selection signal or for selecting none of the hit signals to be output as the selection signal, in response to the decoding signals.

29. The multi-way set-associative cache memory as claimed in claim 28, wherein the storing means comprises at least one fuse.

30. The multi-way set-associative cache memory as claimed in claim 28, wherein the number of the input terminals is a number obtained by adding 1 to a difference between the maximum selectable way number and the minimum selectable way number of the data and tag memories.

31. The multi-way set-associative cache memory as claimed in claim 26, wherein each of the selection signal generating circuits receives one of the hit signals corresponding to the selected tag ways of the tag memory when the data way corresponding to the data memory is selected, and each of the selection signal generating circuits receives none of the hit signals and does not output the selection signal when the data way corresponding to the data memory is not selected.

32. The multi-way set-associative cache memory as claimed in claim 22, wherein the signal designator designates the one hit signal among the plurality of hit signals for output as a selection signal in response to a programming signal.

33. A multi-way set-associative cache memory comprising:
   a data memory being divided into a plurality of data ways, the data memory for storing data to be used by a processor;
   a tag memory being divided into a plurality of tag ways, the tag memory for storing a tag address;
   comparing means for respectively comparing a predetermined address from the processor with tag addresses stored in tag ways of the tag memory to output hit signals respectively representing whether or not the predetermined address is identical with the tag address stored in each tag way of the tag memory; and
   a cache memory size selection circuit for selecting for operation the hit signals corresponding to a portion of the tag ways of the tag memory and a portion of the data ways of the data memory, the number of selected hit signals being equal to the number of selected data ways of the data memory, wherein the cache memory size selection circuit receives the plurality of hit signals, each hit signal from a corresponding tag way, and outputs a plurality of selection signals, each selection signal corresponding to a data way, and wherein the cache memory size selection circuit further comprises a selection signal designator that designates one hit signal among the plurality of hit signals from the corresponding selected tag ways for output as a selection signal for each of the plurality of selection signals corresponding to a selected data way.

34. The multi-way set-associative cache memory as claimed in claim 33, wherein the cache memory size selection circuit further comprises an output circuit for supplying the processor with data stored in a data way corresponding to the data memory when one of the hit signals indicates that the tag address stored in the tag way corresponding to the tag memory is identical with the predetermined address.

35. The multi-way set-associative cache memory as claimed in claim 34, wherein the selection signal designator of the cache memory size selection circuit comprises:
   a plurality of selection signal generating circuits corresponding respectively to the data ways of the data memory, the selection signal generating circuits each receiving one of the hit signals corresponding to normally functioning tag ways of the tag memory to output a selection signal for selecting a data way corresponding respectively to the data memory; and
   an output circuit for supplying the processor with the data stored in the data way of the data memory selected by the selection signal.

36. The multi-way set-associative cache memory as claimed in claim 35, wherein each of the selection signal generating circuits outputs the selection signal such that the output selection circuit supplies the processor with none of the data stored in the data memory when all the hit signals indicate that the predetermined address is not identical with the tag address stored in the tag way corresponding to the tag memory.

37. The multi-way set-associative cache memory as claimed in claim 35, wherein each of the selection signal generating circuits receives one of the hit signals corresponding to the selected tag ways of the tag memory when the data way corresponding to the data memory is selected, and each of the selection signal generating circuits receives none of the hit signals and does not output the selection signal when the data way corresponding to the data memory is not selected.

38. The multi-way set-associative cache memory as claimed in claim 35, wherein each of the selection signal generating circuits receives a different hit signal.

39. The multi-way set-associative cache memory as claimed in claim 38, wherein each of the selection signal generating circuits comprises:
   input terminals for receiving the hit signals corresponding to the selected tag ways of the tag memory;
   storing means for storing information as to whether one of the hit signals is received from the comparing means;
   a decoder for decoding the information stored in the storing means to output decoding signals; and
   a selection signal generator for selecting one of the hit signals input via the input terminals to be output as the selection signal or for selecting none of the hit signals such that the selection signal is not output, in response to the decoding signals.

40. The multi-way set-associative cache memory as claimed in claim 39, wherein the storing means comprises at least one fuse.

41. The multi-way set-associative cache memory as claimed in claim 39 wherein the number of the input terminals is a number obtained by adding 1 to a difference between the maximum selectable way number and the minimum selectable way number of the data and tag memories.

42. The multi-way set-associative cache memory as claimed in claim 33, wherein the signal designator designates the one hit signal among the plurality of hit signals for output as a selection signal in response to a programming signal.

* * * * *